United States Patent [19]

Letchak et al.

[11] Patent Number: 5,661,463
[45] Date of Patent: Aug. 26, 1997

[54] D.C. BATTERY PLANT ALARM MONITORING REMOTE APPARATUS

[75] Inventors: Edward A. Letchak, Telford; Stephen M. Citrullo, Reading, both of Pa.

[73] Assignee: Communications Test Design, Inc., West Chester, Pa.

[21] Appl. No.: 422,451

[22] Filed: Apr. 17, 1995

[51] Int. Cl.⁶ .................................................. G08B 21/00
[52] U.S. Cl. .......................... 340/636; 324/426; 324/427; 324/431; 324/433; 320/48
[58] Field of Search ................................... 340/636, 660, 340/661; 324/426, 427, 428, 431, 433; 320/48

[56] References Cited

U.S. PATENT DOCUMENTS

| | | | |
|---|---|---|---|
| 3,676,770 | 7/1972 | Sharaf et al. | 324/430 |
| 3,731,189 | 5/1973 | Sharaf et al. | 324/710 |
| 3,753,094 | 8/1973 | Furuishi et al. | 324/430 |
| 3,786,343 | 1/1974 | Ehlers | 324/434 |
| 4,052,717 | 10/1977 | Arnold et al. | 324/432 |
| 4,056,815 | 11/1977 | Anderson | 340/539 |
| 4,259,639 | 3/1981 | Renirie | 324/430 |
| 4,423,378 | 12/1983 | Marino et al. | 324/427 |
| 4,423,379 | 12/1983 | Jacobs et al. | 324/429 |
| 4,638,237 | 1/1987 | Fernandez | 320/48 |
| 4,678,998 | 7/1987 | Muramatsu | 324/427 |
| 4,697,134 | 9/1987 | Burkum et al. | 320/48 |
| 4,743,855 | 5/1988 | Randin et al. | 324/430 |
| 4,931,738 | 6/1990 | MacIntyre et al. | 324/435 |
| 4,947,123 | 8/1990 | Minezawa | 324/427 |
| 4,952,862 | 8/1990 | Biagettii et al. | 320/48 |
| 5,027,294 | 6/1991 | Fakruddin et al. | 364/550 |
| 5,047,772 | 9/1991 | Wurst et al. | 324/430 |
| 5,047,961 | 9/1991 | Simonsen | 364/550 |
| 5,095,537 | 3/1992 | Caillet et al. | 324/432 |
| 5,239,286 | 8/1993 | Komatsuda | 340/636 |
| 5,241,275 | 8/1993 | Fang | 324/430 |
| 5,250,904 | 10/1993 | Salander et al. | 324/430 |
| 5,281,920 | 1/1994 | Wurst | 324/430 |
| 5,321,626 | 6/1994 | Palladino | 324/432 |
| 5,325,041 | 6/1994 | Briggs | 320/44 |
| 5,345,392 | 9/1994 | Mito et al. | 364/483 |
| 5,371,682 | 12/1994 | Levine et al. | 364/483 |

*Primary Examiner*—Jeffery Hofsass
*Assistant Examiner*—Ashok Mannava
*Attorney, Agent, or Firm*—Ratner & Prestia

[57] ABSTRACT

An automatic monitoring system of storage batteries housed at an application site which includes an A.C. power source at the site, a mechanism to interrupt the A.C. power from its source and generate an alarm, a battery plant to provide D.C. power when the A.C. power is interrupted, a mechanism to automatically detect and measure the voltages generated from said battery plant, a mechanism to measure the mid-point of the D.C. battery discharge voltage by measuring the rate of change of said voltage over time and halving the difference between plateau and end of life voltages, a mechanism to generate an alarm message (a) if said mid-point has been reached, (b) if a predetermined low battery cutoff voltage has been reached, (c) if the battery plant is being overcharged or undercharged, and/or (d) if A.C. power is interrupted. The alarm messages are generated while taking into consideration an environmental condition, such as temperature, which causes an adjustment to the measured voltages received from the battery plant. A computer is used to display the alarm messages for appropriate corrective action by a technician located at an operations center.

20 Claims, 5 Drawing Sheets

D.C. BATTERY PLANT ALARM MONITORING REMOTE APPARATUS

BACKGROUND OF THE INVENTION

This invention relates to high capacity D.C. battery backup systems and more particularly to the automatic measurement of battery cell capacity under actual load conditions to automatically activate an alarm system when the battery backup is incapable, or expected to be incapable, of providing uninterrupted service for a predetermined period of time if the main power source fails.

High capacity secondary or backup batteries are used in stationery applications such as at remote telephone equipment sites, electric utility substations, and industrial plants to perform vital functions of circuit breaker tripping and automatic switching, to provide for the orderly shut-down of generating units in an emergency, including the starting of emergency diesel-generators, and to power other similar equipment. These battery systems are commonly used to provide backup power in case there is a failure of a commercial A.C. power grid.

Some applications require a longer-term delivery of battery energy. These include emergency lighting for plants and hospitals and computer and communications equipment. Batteries must be ready to deliver their stored energy on demand to provide the needed uninterrupted service for a given period of time. Another typical application for an uninterruptible power supply is between a power grid and a large computer system. This application is used by financial, communication, manufacturing and other commercial industries. If the high capacity battery system is taken "off-line" for any reason, the necessary protection against power outages is lost at the time the battery system is not connected.

In summary, battery backup systems must be monitored and tested on a regular basis to ensure that sufficient back up energy from a D.C. power system is always available. Although batteries are reliable, any failure to supply the required energy would often result in serious or disastrous consequences.

The monitoring of battery backup systems to prevent said disastrous consequences is particularly needed with regard to telecommunications equipment. The battery backup system used with said equipment is deployed in large central office facilities to provide telephone and other services to both public and private business service customers. In order to provide services to rural and concentrated areas, telecommunications equipment is deployed in small facilities such as cabinets and controlled environmental enclosures. All equipment is powered primarily from A.C. provided by the local utility company. The primary A.C. power is backed up by a battery plant system which provides the D.C. power needed to operate the equipment. The backup system maintains the highly reliable telephone service used with said equipment.

Typically, a large industrial battery backup system includes a string or a plurality of parallel strings of serially connected rechargeable battery cells and a charger connected to the A.C. commercial power grid for maintaining the charge on the battery cells. Many of these battery backup systems, called "uninterruptible power supplies", are configured such that the load is never aware of any failure of the power grid because the battery system immediately supplies the necessary energy upon failure of the A.C. power grid.

Electric utility installations generally consist of 24, 60, or 120 individual 2-volt cells, which comprise a plurality of battery cells, connected together to provide 48, 120 or 240 volts D.C. The normal, steady-state load of sensors, indicating lights, relay coils, and electronic apparatus are supplied by a charger connected to the battery terminals. The charger also maintains the battery in a fully-charged state (i.e. electrolyte specific gravity of 1.230 for a typical lead-acid battery). This is known as a float-charge operation. The normal load applied to these batteries is complex and varies with time. It often is not possible to disconnect these loads for test purposes without interrupting the main circuits they control.

The battery terminal voltage or specific gravity of each cell making up the battery is an indicator which has been used to determine battery state-of-charge. It has been standard industry practice to take periodic specific gravity measurements and to conduct visual and other checks to determine battery state-of-charge. More and more systems are employing sealed cells where the measurement of specific gravity is not practical, however, specific gravity readings do not entirely indicate a battery system's ability to supply power. For example, the specific gravity for each cell in a battery may indicate a fully-charged ready state, but a high impedance in one intercell connection can prevent the battery from functioning as intended. It is therefore necessary to determine if a high impedance inter connection exists between one or more cells of a battery plant in determining whether the battery system can function as intended.

Load discharge tests can also be used to prove a battery system's ability to perform. A discharge test is specified by nuclear regulatory commission regulations 0123 (BWR) and 0452 (PWR) for each critical battery of a nuclear generating unit. These tests must be performed each time a unit is refueled. Each discharge reduces the remaining service life of a battery and may cause deterioration which can impair the battery's ability to function next time in an on-line situation. A low discharge test result may indicate trouble, but it will oftentimes not locate it.

The most accurate method of determining the actual capacity of a battery system is load testing or internal impedance measurements. Load testing and internal impedance measurements require on-site testing and evaluation by maintenance personnel or the collection of large amounts of historical data which are labor-intensive, require management coordination and can delay problem reporting.

While there are several methods and processes used to measure battery plant condition, these methods and processes have drawbacks. The measurement of the open circuit voltage is one method, but requires disconnection from the system for 24 hours. Thus, there is no backup power supply for 24 hours. The battery cell condition evaluation methods, as noted above, require substantial labor and the collection of large amounts of historical data. The measurements are taken by technicians on site and are thus labor intensive and costly. The measurement of the float voltage is also not a good method because internal impedances of the cells can rise over time.

It is thus important to have in-service indication that a battery is able to deliver its stored electrochemical energy when required, and also a means for locating an abnormal condition in one or more batteries while the battery system remains in service. Although routine visual inspections, specific gravity readings, voltage readings and periodic equalizing charge are all presently used in the prior art to keep a battery system ready to perform, they each have drawbacks which have accentuated the need for a fully automatic system which ensures that a battery system is ready to perform in the event A.C. power is interrupted. This automatic system should be a simple, reliable method of determining critical battery capacity and reporting an alarm message to avoid major failures or service outages. The below noted prior art has attempted to meet, but has not met, these needs.

U.S. Pat. No. 5,281,920 discloses an impedance measurement of battery cells within a battery system comprising one string of battery cells. The measurement is accomplished by dividing each of the strings into two portions. The loading current is only imposed on a portion of one of the strings at any given time. Battery cell voltage measurements are made only within the string portion.

U.S. Pat. No. 4,697,134 discloses a testing device measuring the impedance of secondary cells that form a battery system while the battery system is in a float charged condition and is connected to an active electrical load. The impedance measurement is made at a frequency selected to be different from those frequencies otherwise present in the charger load circuit. The device monitors the battery for a change in impedance that can signal a developing defect in one or more cells or connections that can prevent the battery from delivering stored energy to the load. The testing device is also used to compare the impedance of individual cells and connections to locate faulty components.

U.S. Pat. No. 5,321,626 teaches a system of battery cells and batteries monitored via sensing probes arranged in assemblies providing digital output signals which indicate sensed physical parameters. Data strings are provided to the probes and are modified to reflect present values of sensed parameters. The resultant data strings are processed and compared to store historical data to monitor and forecast performance of a system of connected batteries.

U.S. Pat. No. 4,743,855 addresses a method of measuring the state of discharge of a battery. The method consists in measuring a first internal impedance of the battery at a first frequency and a second internal impedance of the battery at a second frequency. Then a determination is made of the difference between the internal impedances which is representative of the state of discharge of the battery. This method provides an accurate way to check whether the batteries are in good working order.

Based on the drawbacks to prior art systems as noted above, it is an object of the present invention to detect changes in the overall capacity of a multicell secondary storage battery, including inter-cell connectors, by the continuous monitoring of the terminal to terminal voltage and battery string temperature while the battery string is connected to an active load.

It is also an object of the present invention to locate a defect from an individual cell or multiple cells of a multicell secondary storage battery, including during periods when the battery is connected to an active electrical load.

It is an additional object of the invention to obtain an automatic and accurate indication of a backup battery plant's capability to sustain the operation of equipment under actual environmental conditions without interrupting the D.C. power to the equipment so that an alarm may be activated if the backup battery plant is incapable of providing the necessary power for extended periods of time in the event the primary A.C. power is interrupted.

It is still a further object of the present invention to provide a procedure for determining and predicting a secondary storage battery's ability to supply power to a load, including during testing periods when the storage battery is connected to an active load.

It is an object of the present invention to provide an automatic D.C. battery plant alarm monitoring system, which minimizes the cost and time of labor in evaluating the performance and/or capability of the battery plant backup system.

It is another object of the present invention to activate an alarm when the backup battery system is incapable of supplying the required energy when the A.C. power grid fails. It is a further object of the present invention to provide an automatic alarm if the backup system is incapable of handling the energy requirements of the load for an extended period of time.

It is a further object of the present invention to provide necessary alarms in case the equipment at the application site is not operating correctly or will not operate correctly upon activation for a given time period.

SUMMARY OF THE INVENTION

The present invention from a generic standpoint involves a dynamic characterization of the battery plant under actual load conditions with an algorithm to determine mid-point capacity of the battery system with accurate evaluation of environmental variables which affect battery performance. All characterization results for determining capacity of batteries require adjustments for environmental variations such as temperature. In the present invention, the dynamic characterization of the battery plant determines the expected voltage level for the mid-point capacity or 50% capacity level of the battery plant. This data point and other significant data points on the expected characterization curve of the battery system are used to evaluate adequate performance of the equipment. Deviations from the projected response, with consideration of environmental factors, are evaluated by a microcontroller and software to initiate an alarm message if the battery plant will not perform adequately.

More specifically, the alarm monitoring remote (AMR) device of the present invention is a simple and reliable device for measuring battery plant capacity during operation of the battery backup system. This device reports alarm messages to a remote operations center, via a discrete alarm monitoring system (DAMS), using standard telephone network management protocol. After receiving the alarm reports from the AMR and completing a time analysis of the reports, the operations center personnel determine sufficient capacity of the battery system, determine if sufficient capacity exists to defer dispatch decision until a later time or dispatch a technician to the battery plant site to replace a bad battery or batteries. Evaluation of selected battery backup system sites can be performed by the operations center personnel executing commands through the DAMS system and AMR unit at the specific site location. The commands would activate the battery backup system by disconnecting the D.C. rectifier equipment. The operations center personnel would evaluate the performance of the selected site as described. In this manner, automatic and periodic measurements of individual battery backup system are taken without the need for a technician to go on site. The measurements are adjusted for environmental variations such as temperature without the need of costly on site inspections. A reliable and less costly method of testing battery backup systems is thus presented by this invention.

BRIEF DESCRIPTION OF THE DRAWINGS

The foregoing invention will be more readily understood upon reading the following description in conjunction with the drawings wherein.

DETAILED DESCRIPTION OF THE DRAWINGS

Figure 1:
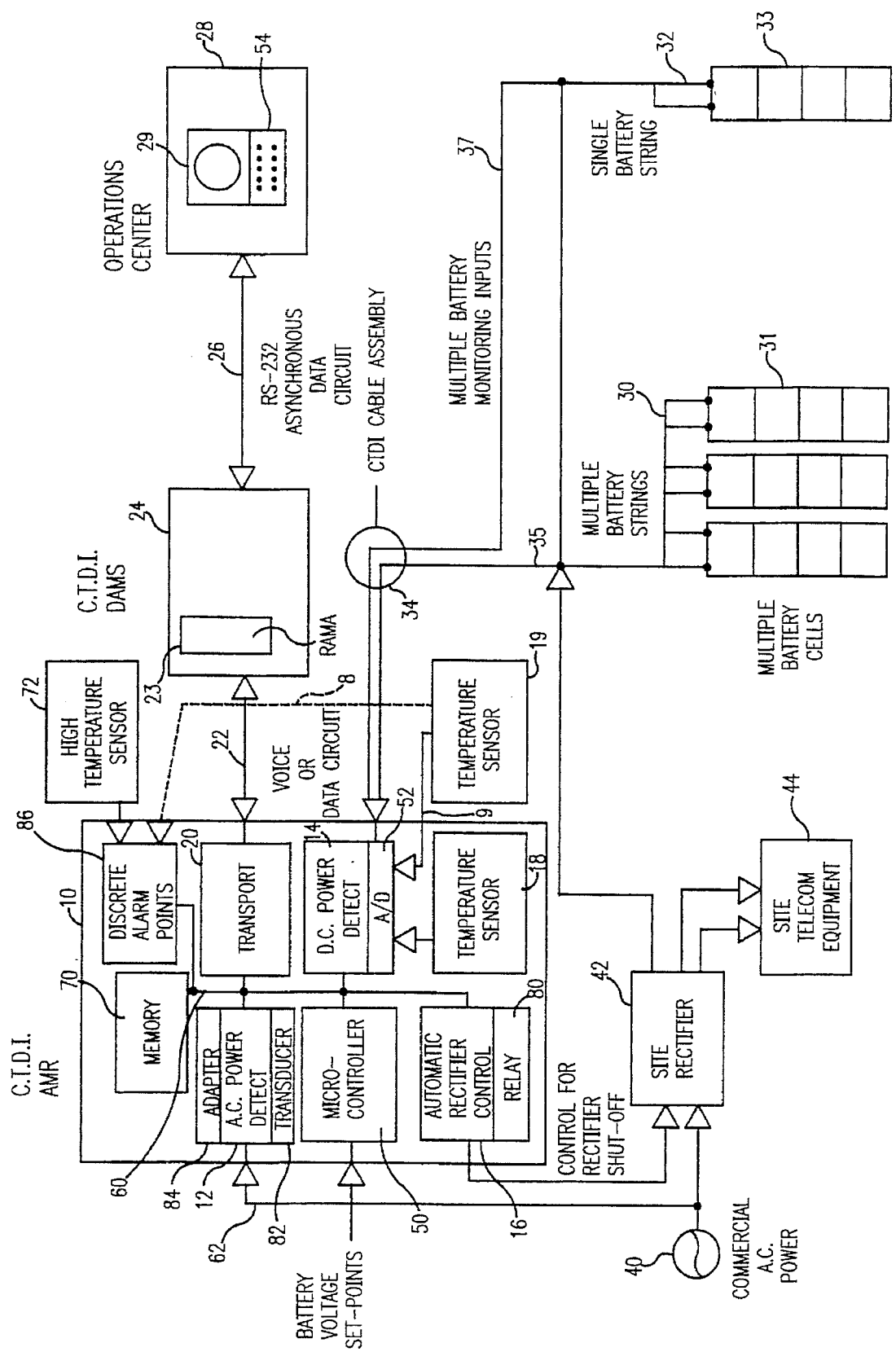
FIG. 1 is an overall block diagram of a battery plant alarm monitoring system.

FIG. 1 illustrates a battery plant alarm monitoring block diagram. In FIG. 1, there is shown an alarm monitoring remote device 10, called an AMR, a discrete alarm monitoring system 24, called a DAMS unit which is commercially manufactured by CTDI, and an operations center 28. These are the three principal blocks of the battery plant alarm monitoring system.

a. The AMR Device 10

The alarm monitoring remote (AMR) device 10 contains several submodules to facilitate battery characterization and the detection of battery failure. The AMR 10 submodules include, inter alia: an A.C. power detection module 12, a D.C. power detection module 14, a rectifier control module 16, a temperature sensing module 18, a microcontroller module 50, a memory module 70 and a transport module 20. The microcontroller 50 is the heart of the AMR device 10 and continually monitors and controls the other AMR submodules according to a main control program and a battery monitoring software algorithm contained within memory 70. The D.C. module 14 connects across two distinct battery plants 30 and 32 with two leads on each plant string to obtain voltage measurements. An analog to digital (A/D) converter circuit 52 is contained within module 14. Converter 52 functions to convert the analog D.C. voltage received from either or both battery plants 30 and 32 into a digital or byte encoded word that is used by the microcontroller 50 to detect error-free or faulty battery plant operation. The rectifier control module 16 contains control circuitry 80 used to activate the "on" or "off" state of rectifier 42.

The transport module 20 is the main alarm communication link. It sends and receives data over a voice or data circuit 22 to and from the discrete alarm monitoring system (DAMS) unit 24 which includes a special interface module 23 (RAMA). The RAMA interface module 23 can be connected to the other AMR 10 submodules over additional data circuits 22. The AMR microcontroller 50, connected to bus 60, monitors the ambient temperature on site through a temperature sensor module 18 to help formulate or determine the environmental conditions for battery plant 30 or 32. The temperature sensor module 18 provides an analog voltage to A/D converter 52 which converts the ambient temperature message into digital form for use by the microcontroller 50. The temperature sensor module 18 is an integral AMR feature for battery plant monitoring in a cabinet, controlled environmental vault, or hut. The microcontroller 50 uses input data from the A.C. power detection module 12, the D.C. detection module 14 and temperature sensor module 18 to define the expected and actual state of operation of the monitored battery plant. The microcontroller 50 uses this input data to characterize the actual performance of the battery plant versus expected performance and initiates an alarm message over bus 60 for abnormal deviations from expected performance. This alarm message is sent over bus 60 to the transport module 20 for transmission to the DAMS unit 24. The microcontroller 50 uses the characterization data of the battery plant to forecast expected voltage levels of the plant which represent a 50% capacity level for the battery plant. The manner by which the invention defines the expected state of battery operation, determines the state of actual battery operation, including temperature adjustments to the measured D.C. voltage level derived from a given battery plant, and calculates the 50% capacity level for the battery plant is treated below in the description of the operation of the invention.

Two separate backup battery plants are shown in FIG. 1. The first is a multiple battery string 30 containing four batteries in each of the three strings. One such battery in the string bears reference numeral 31. The second plant is a single battery string 32 containing four individual batteries, one of which bears reference numeral 33. The single battery string 32 is connected to the A/D converter 52 of AMR 10 over lead 37. The multiple battery string 30 is also connected to the A/D converter 52 over lead 35. Leads 35 and 37 bridge onto the end terminals of the battery plant strings and are also connected to a cable assembly 34 which is a simple way to form a connection between, or bridge from, the battery plants to the AMR device 10. By virtue of the multiplexed connection between the battery plants and the A/D converter 52, the AMR device 10 can obtain the necessary voltage indications from the battery plants to monitor backup battery performance and capability. The presently constructed AMR device 10 can monitor one to seven battery plant strings through separate interconnection cables for each string. Each interconnection cable connects to the battery string end terminals where the D.C. voltage is measured, providing a nominal terminal voltage of 48 volts. Each string is monitored independently by the AMR device 10 through the separate interconnection cables.

An electronic transducer 82 (manufactured by D&B Power, part No. F090-0100) is contained within the A.C. power detect module 12 to detect A.C. failure. When A.C. power is interrupted or an insufficient amount of A.C. is provided, the transducer 82 in module 12 detects the faulty condition and through microcontroller 50 initiates an alarm message which is transmitted through transport module 20, via DAMS unit 24, to the operations center 28. The A.C. power detect module 12 contains a lead 62 which plugs directly into or is bridged onto a standard commercial A.C. source 40. A multiple A.C. outlet adapter 84 (manufactured by McMaster-Carr, part No. 7163K35) is provided with module 12 to provide sufficient A.C. outlet capacity. When the A.C. power is shut-off, the equipment or system serviced by the A.C. power derives its energy solely from the D.C. backup battery plant, and such D.C. energy is available to maintain operation of the equipment at the site. Continuous change in the operating voltage of the D.C. battery plant provides real time data to characterize the performance of the D.C. battery system. The battery monitoring circuitry in the D.C. power detect module 14 also detects battery overcharging or undercharging if A.C. is present and battery plant discharge if A.C. is not present. Abnormally low D.C. plant voltage conditions, when A.C. is not present, cause the AMR device 10 to activate an alarm.

The AMR device 10 activates an alarm at the midpoint (50%) capacity level of the D.C. plant based on the D.C. charge rate. The time interval between the A.C. alarm activation, which indicates that A.C. power has been interrupted, and the D.C. plant alarm activation (at the 50% level) indicates the approximate time remaining before the battery plant is completely discharged and customer service is adversely affected. This complete discharge time interval is determined by a clock in the DAMS system 24 and is sent with the message reports on the respective alarms.

The AMR device 10 is a remote alarm monitoring unit for monitoring environmental and serial equipment type alarms in a variety of remote enclosures including cabinets and customer premise applications. The configurable alarm monitoring capacity of one AMR is 64 discrete alarms and 7 serial displays of 64 alarms each, thus having a 512 alarm capacity. The device is powered from the standard −48 D.C. voltage plant. Standard capabilities include the monitoring of eight normally open or normally closed dry alarms, the activation of two normally open dry controls, a configurable high temperature sensor module and communication to the host through an integral modem.

There may be many AMR 10 devices deployed, each at a different site. Each AMR configuration contains a standard alarm for reporting communication failures. Standard discrete alarm can be configured as normally open or normally closed. The AMR communications interface contains secondary protection from transients Such as lightening strikes and power crosses. Internal AMR self diagnostics are executed at regular intervals to ensure alarm reporting integrity. The AMR device 10 contains LED indicators to indicate adequate data communication over the communications port or to indicate a unit failure.

b. The DAMS Unit 24 and Operations Center 28

The operations center 28 contains a monitor 29 and keyboard 54 which may be used to initiate a request to the DAMS unit 24 to test a particular battery plant. The DAMS unit 24 may be a DAMS II or DAMS III shelf manufactured and commercialized by CTDI as model Nos. 288 and 384 respectively. The DAMS unit 24 processes this message request to the appropriate AMR device 10. The AMR device 10 turns off A.C. power to the battery plant. An A.C. fail report is generated by the AMR device 10 and sent via the transport module 20 and the RAMA 23 and DAMS unit 24 to the operations center 28. The AMR device 10 then monitors the D.C. battery plant voltage using a software algorithm (FIG. 3) and also reports a D.C. fail report to the operations center 28, via DAMS unit 24, at the estimated 50% capacity point of the battery plant under scrutiny. The remote site system is reset for normal operation. If the A.C. alarm does not clear after the reset command, a repeated A.C. alarm message is sent by the DAMS system 24 to initiate action on the problem. The time interval between the A.C. failure report and the fail report at the 50% capacity point represents the time interval that the battery plant can maintain adequate operation of the equipment at the specific site. Multiplying this interval by two represents the total battery plant capacity for the specific site.

After battery plant testing is performed by AMR device 10, the result of the testing is sent to the DAMS unit 24. The test result is converted by DAMS unit 24 from a parallel byte encoded word generated in microcontroller 50 to a serial data string that is transported through the two or four wire voice/data circuit lead 22. The RAMA (Remote Alarm Monitor A unit) (CTDI commercial model Nos. 991086 or 991101) unit 23 in the DAMS unit 24 (a) collects alarm information from AMR devices and tabulates it into a higher language through the DAMS system 24 which is transmitted to and understood at the operations center 28, and (b) collects information from multiple AMR devices. The DAMS unit 24 thus importantly provides appropriate message characterization between the AMR device 10 and the operations center 28. The DAMS unit 24 provides information to the operations center 28 through a communications network which is connected to a network monitor analysis computer (NMAC). This computer generates an alarm or trouble ticket based on the information received. Thus, the DAMS unit 24 provides the appropriate interface (permits information to be transferred) between the AMR device 10 and the NMAC at the operations center 28.

The AMR device 10 communicates with the DAMS unit 24 through the RAMA unit 23 located in a DAMS II or DAMS III shelf in a central office or to an existing telemetry byte oriented serial (TBOS) alarm monitoring system. The RAMA unit 23 contains one RS-232 maintenance port and five communication ports allocated to remote communication with multiple AMR devices. Unit 23 polls each AMR device every 200 milliseconds and will activate an alarm if there is a communications failure with an AMR device. Communications can occur by modem over a dedicated dry pair of wires or a dedicated voice circuit connected directly to the AMR device 10 from the RAMA unit 23 in the DAMS unit 24. The modem interface on the RAMA unit 23 and AMR device 10 can operate at 300 or 2400 BAUD rates over dedicated voice circuit 22 with a modem interface or a dedicated overhead data circuit with an RS-422 or RS-232 interface. The modem interface on both the RAMA unit 23 and AMR device 10 is equipped with optional capabilities to operate in dial-up mode. The RAMA unit 23 can communicate TBOS to other alarm monitoring (AMR) systems in communication with it.

Dial-up capability resides on the AMR baseboard and provides capabilities to go off-hook and dial-up to the RAMA unit 23 in DAMS unit 24 whenever a change in state occurs. A report on the change is generated in the DAMS unit 24. The RAMA unit 23 will dial-up to the AMR device 10 each hour and verify AMR functionality if the AMR device 10 has not called the RAMA unit 23. A maintenance port on the RAMA unit 23 is used to initialize the dial-up phone numbers and dial-up modes.

The communication network between DAMS unit 24 and operations center 28 may use an RS-232 asynchronous data circuit interface 26. This interface can be easily accessed through NMAC in the operations center 28.

c. Other Equipment

In FIG. 1, there is a site rectifier 42 (AT&T Lineage 2000 System®, AT&T SLC Series 5® 337 A Battery Charger (5SC B800FXX), or 3B Battery Charger 6C332) and site telecom equipment 44. The site rectifier 42 provides D.C. power to all remote equipment at the site and recharges the batteries to maintain the float voltage thereon. The site telecom equipment 44 may include multiplexors, lights, sensors, transducers, etc.

The temperature sensor 18, also shown in FIG. 1, is distinguished from a high temperature sensor 72 which can activate a high temperature alarm in the AMR device 10 for the ambient temperature of the equipment at the site. Temperature sensor 18 provides dynamic data to the microcontroller 50 through the A/D unit 52 to be used in the performance evaluation of the battery plant voltage. The activation point for the high temperature alarm is selected from one of the following three settings: 140 degrees F., 158 degrees F., or 176 degrees F. When the high temperature sensor senses a temperature which is equal to the predetermined setting, the high temperature alarm is activated on AMR device 10 and an appropriate message is received through DAMS unit 24 by the operations center 28.

The AMR device 10 is also able to identify in a string of batteries which battery is not performing as expected. AMR device 10 accomplishes this function through use of temperature sensor 19 or 72. When there is too much current through or from the battery, the battery heats up. The present invention includes a temperature sensor 19 for each battery cell or one for each string of batteries. Temperature sensor 19 is thus a string of temperature sensors located on each battery or string of batteries. Temperature sensor 19 is connected through the discrete alarm circuitry unit 86 or A/D converter 52 to microcontroller 50 in the AMR device 10. The connection between the temperature sensor 19 and discrete alarm unit 86 is shown as a dashed line 8 in FIG. 1 to connote that it is an altenative connection to the one 9 between sensor 19 and converter 52. When a given temperature sensor in sensor 19 senses a predetermined temperature representative of a failed battery or one that is not performing as expected, the microcontroller 50 through transport module 20 and the DAMS unit 24 informs the operations center 28 of this failure or potential failure state so that a technician can be dispatched to replace the failed or insufficient battery cell or cells.

d. Operation

The operation of the AMR device 10 will be explained in reference to FIG. 2. The AMR device 10 monitors strings of –48 volt D.C. sealed lead-acid or non sealed batteries. The battery plant strings are monitored by 2 wires used to measure the effective D.C. voltage. The measured battery voltage is adjusted by the ambient temperature. Each battery plant voltage recorded is an average of several measurements over time in order to eliminate inaccuracy due to the effect of equipment loading fluctuations, primarily from peak to non-peak traffic (call) times. A.C. power is monitored by an A.C. to D.C. transducer unit 82 in module 12. An AMR device 10 D.C. alarm report is generated (a) when an abnormal charging condition (undercharging or overcharging) occurs in region A of FIG. 2, (b) when the rate of change of the decreasing voltage exceeds expected limits and the plateau voltage of point B is achieved in less time than anticipated, or (c) during discharge at the 50% capacity point as shown by point C in FIG. 2. The main purpose of the AMR device 10 is to report a D.C. battery plant alarm for (a) and (c) above. The 50% D.C. capacity point is determined after A.C. power fails and before the point at which the battery voltage no longer sustains the operation of the equipment. Point D in FIG. 2 is set for the minimum operating voltage of the site equipment.

Figure 2:
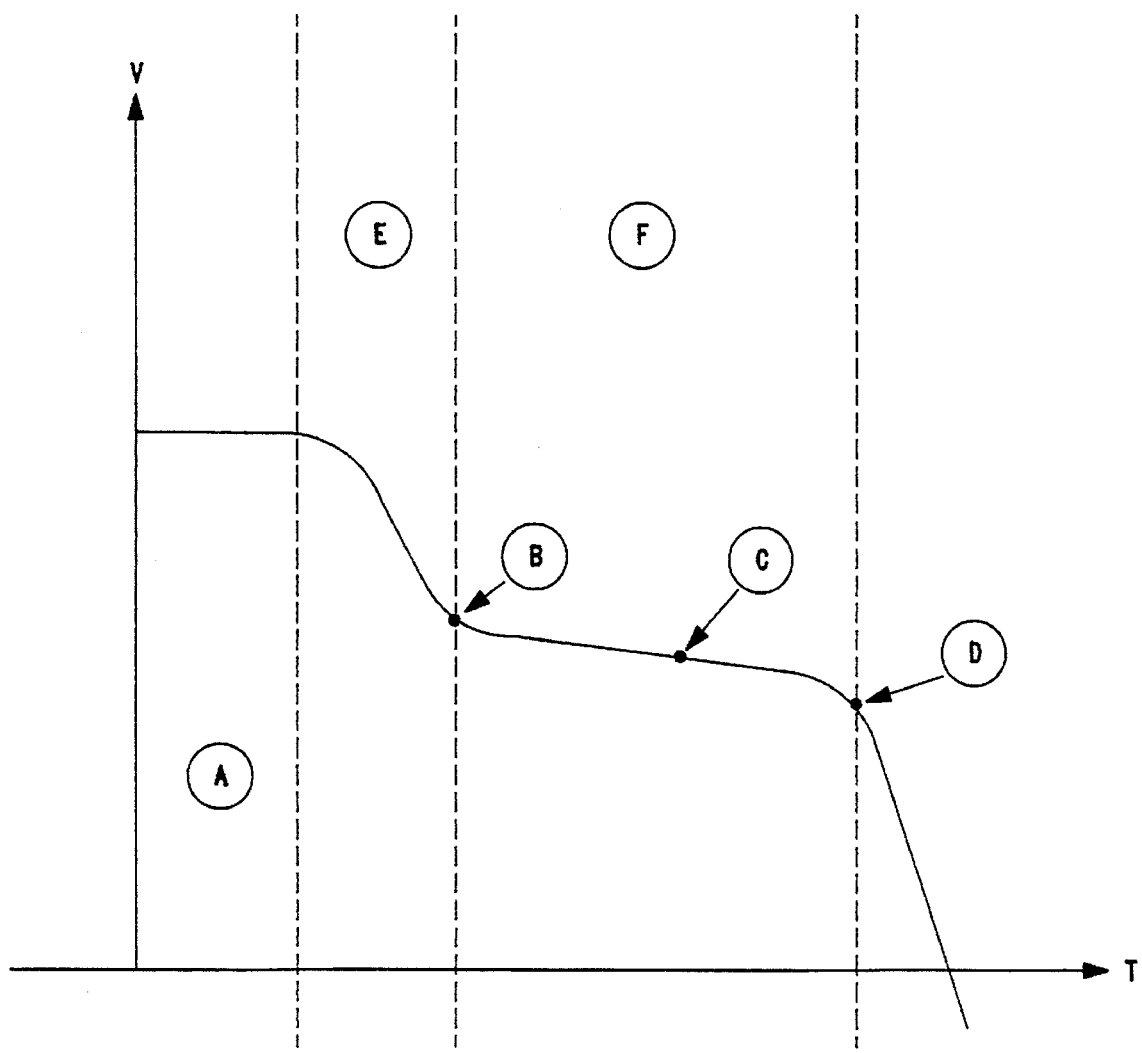
FIG. 2 is a graph of a typical battery discharge.

Region A of FIG. 2 will be addressed first because it deals with abnormal charging conditions while A.C. power is sustaining the equipment. An AMR device 10 D.C. alarm is activated during an overcharging condition when any of the battery inputs to AMR device 10 are greater than a set voltage point plus 1.5 volts and the A.C. fail alarm is not active. The set voltage point is determined by an operator at the site of the AMR device 10, at the central office where the DAMS unit 24 is located or at the operations center 28. The AMR device 10 D.C. alarm is also activated during an undercharging condition when any of the battery voltage inputs are equal to or less than the set voltage point minus 1.5 volts and the A.C. fail alarm is not active.

Regions E and F of FIG. 2 will next be addressed because they follow, respectively, region A in FIG. 2 and reflect the operation of the equipment under D.C. power when A.C. power has been interrupted or is inadequate to sustain operation of the equipment. A.C. power is interrupted, intentionally for test purposes or unintentionally in real time situations, at the point where regions A and E adjoin. At this point battery discharge begins. The AMR device 10 monitors the battery discharge voltage as it drops rapidly to a plateau beginning at point B in FIG. 2. The battery voltage in region E before point B is reached decreases dramatically due to the absence of the A.C. power used to charge the backup D.C. battery plant and sustain the D.C. load current to the site equipment. The rate of change of voltage discharge in region E is a function of the battery voltage, state of charge, load and temperature. Point B, however, is the starting point for plateau voltage evaluation and the calculations performed by the microcontroller 50 in the AMR device 10 in determining the 50% capacity point of the battery plant under scrutiny. This plateau voltage, beginning at point B, drops only slightly over time depending upon capacity, load and temperature of the batteries in the plant until the current capacity of the battery plant is mostly depleted. This occurs at point D in FIG. 2. At that point the voltage drops sharply. This point D is called the knee of the voltage discharge. The 50% capacity point of the battery plant is determined by evaluating the expected rate of change of voltage over time from points B and D. A D.C. battery alarm will go active when the 50% capacity point of the battery plant is reached. The D.C. alarm will remain inactive above the 50% mark. If the voltage drops to the plateau in less time than expected and the voltage level is less than the expected plateau voltage, after A.C. power is lost, the D.C. battery alarm will go active.

The 50% capacity point represents one half the total load time capacity of the battery plant. Activation of the 50% capacity alarm typically occurs halfway between when the A.C. power fails, point B in FIG. 2, and when the battery plant voltage no longer sustains operating the equipment, point D in FIG. 2. This halfway point is approximately at point C of FIG. 2. A description of the operation of the invention between points B and D follows. Prior to point B, the microcontroller module 50 has read the battery voltage set point which indicates the expected nominal float voltage of the battery plant, either 51, 53, 54, 55, 56, 57, 58, or 59 volts. This is the expected performance of the battery plant as set by an operator manually at the site of the AMR device 10, or through DAMS software at the central office or through the operations center 28. The actual battery voltage is measured and stored in memory 70 several times each second. Each input to the AMR device 10 is measured four times and averaged together to obtain an effective battery plant voltage which eliminates any variations due to equipment loading. This effective voltage is recorded and utilized in further calculations.

Each effective battery voltage reading recorded for a 48 volt battery system is then adjusted by a temperature correction factor of –0.05 volts/deg. C. from 25 deg. C. to –20 deg. C. and –2.25 volts for temperatures less than –20 deg. C. The appropriate temperature correction factor is calculated by the microcontroller 50 when the temperature sensor module 18 generates a voltage measurement proportional to the ambient temperature and transforms that voltage measurement into a digital message through A.D converter 52. That digital message is compared with the two temperature ranges (+25° C. to 20° C. and –20 deg. C. and below) and the appropriate voltage adjustment is then determined to derive the temperature correction factor. That factor is then applied as a voltage level adjustment to the effective battery voltage measurement.

The temperature adjusted effective battery voltage measurement is then compared with the anticipated battery voltage for the present condition (which includes temperature) and is also compared to the previous history of the temperature adjusted effective battery voltage measurements for the present state of the battery plant. The previous history information is contained within memory 70. Substantial voltage deviation is expected for a period of time until the nominal plateau voltage at point B (approximately 50.4 V) is reached. A reduction in the maximum deviation of the oldest and current voltage measurements is expected as the voltage approaches the 50.4 V level. If said reduction exceeds the expected rate of change and the voltage level passes through the nominal plateau voltage, an alarm is immediately initiated indicating a very low energy capacity system. For the expected or normal condition, the reduction in the maximum deviation of the previous and current voltage measurements occurs, and the deviation becomes less than several hundred millivolts, the nominal plateau voltage has been reached. In the exemplary embodiment of the present invention, the plateau voltage is determined to have been reached when said rate of change drops to less than four hundred millivolts. Thus, the microcontroller 50 is able to determine when the nominal plateau voltage has been reached by continuously monitoring said maximum deviations over a limited time interval. The microcontroller 50 then calculates the average voltage level, as adjusted by ambient temperature, of the starting point of the plateau and stores this information as historical data. Point B in FIG. 2 is the starting point of the plateau. The battery voltage now changes at a smaller rate shown in region F of FIG. 2. The microcontroller module 50 determines the 50% capacity point by halving the difference between the average voltage level of the starting point of the plateau (Point B) and the battery voltage end of life (Point D). This result is then added to the end of life voltage to obtain the 50%. capacity voltage level. The end of life voltage is entered data by an operator for the equipment application and is stored in RAM memory 70. The voltage value for the 50% capacity point is also stored in memory 70 as is the time that has elapsed between the activation of the A.C. fail alarm and the activation of the D.C. fail alarm which will occur at the 50% capacity point in the future. The 50% voltage value is used by the microcontroller 50 for periodic evaluation. This time period, as reported to the operations center 28 by the DAMS unit 24, informs the system of how much time there is remaining before the D.C. backup battery plant will no longer be able to service the equipment application. This information is available in a report format on request from the AMR unit 10.

The actual D.C. battery voltages are continuously monitored, averaged (to obtain an effective voltage) and, adjusted by the ambient temperature, stored as previous data in memory. The oldest data is replaced by the most recent data. The previous data is analyzed to determine the maximum voltage change to verify the predicted rate of discharge. When the 50% capacity voltage level is reached, the microcontroller 50 evaluates this level for an extended period of time to exclude the effects of load variations. If an abnormal discharge rate is calculated, the 50% capacity voltage value may be adjusted to accelerate or delay the alarm based on the previous data already recorded in memory.

The AMR device 10 with the DAMS unit 24 can autonomously control the transfer of the battery plant from backup to load by using a control point relay 80. The DAMS unit 24 sends the AMR device 10 a byte encoded message telling the AMR device 10 to activate a designated relay 80 located in the automatic rectifier control module 16. This relay 80 is connected to the rectifier remote control shut-off circuitry. The activation of this relay 80 turns the rectifier 42 off, interrupts A.C. power and places the remote equipment on D.C. battery power. The DAMS unit 24 verifies the rectifier 42 major alarm. The AMR device 10 monitors the battery plant voltages and reports the 50% capacity point as explained above. The DAMS unit 24 verifies this report and sends a message to deactivate the relay 80 to restore the rectifier 42 to the "on" state after receipt of the 50% D.C. alarm. The DAMS unit 24 verifies that the A.C. fail alarm has been deactivated. If the A.C. fail alarm does not get deactivated, the DAMS unit 24 periodically activates and deactivates the battery fail alarm to draw attention to the critical condition. Therefore, under program control, the AMR device 10 can interrupt A.C. power, thereby starting a discharge, calculate the 50% capacity point and then restore A.C. power. The AMR device 10 can also autonomously determine the capacity of the battery strings by evaluating the discharge voltage when the D.C. battery plant load condition exists.

Figure 3:
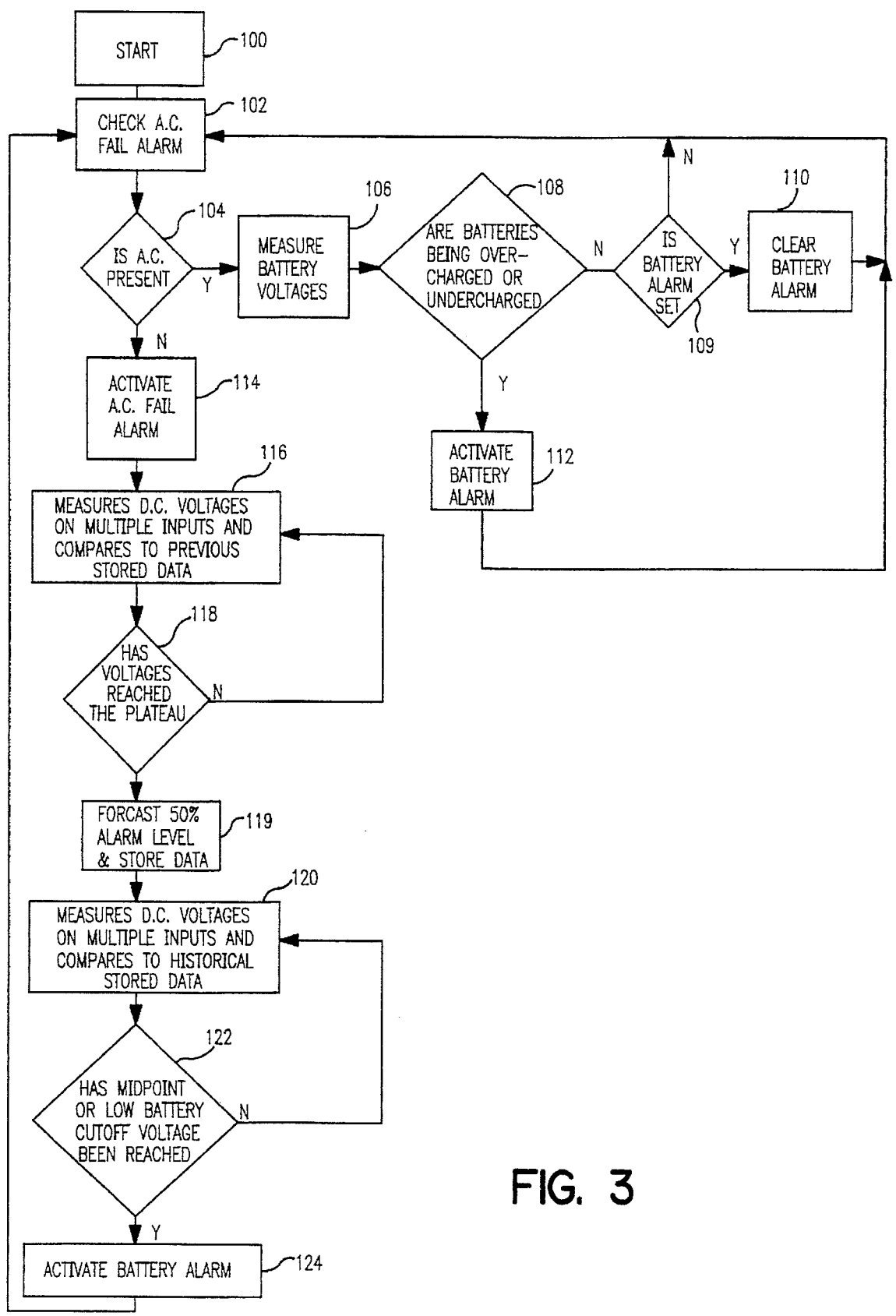
FIG. 3 is a battery monitoring flow diagram.
Figure 5:
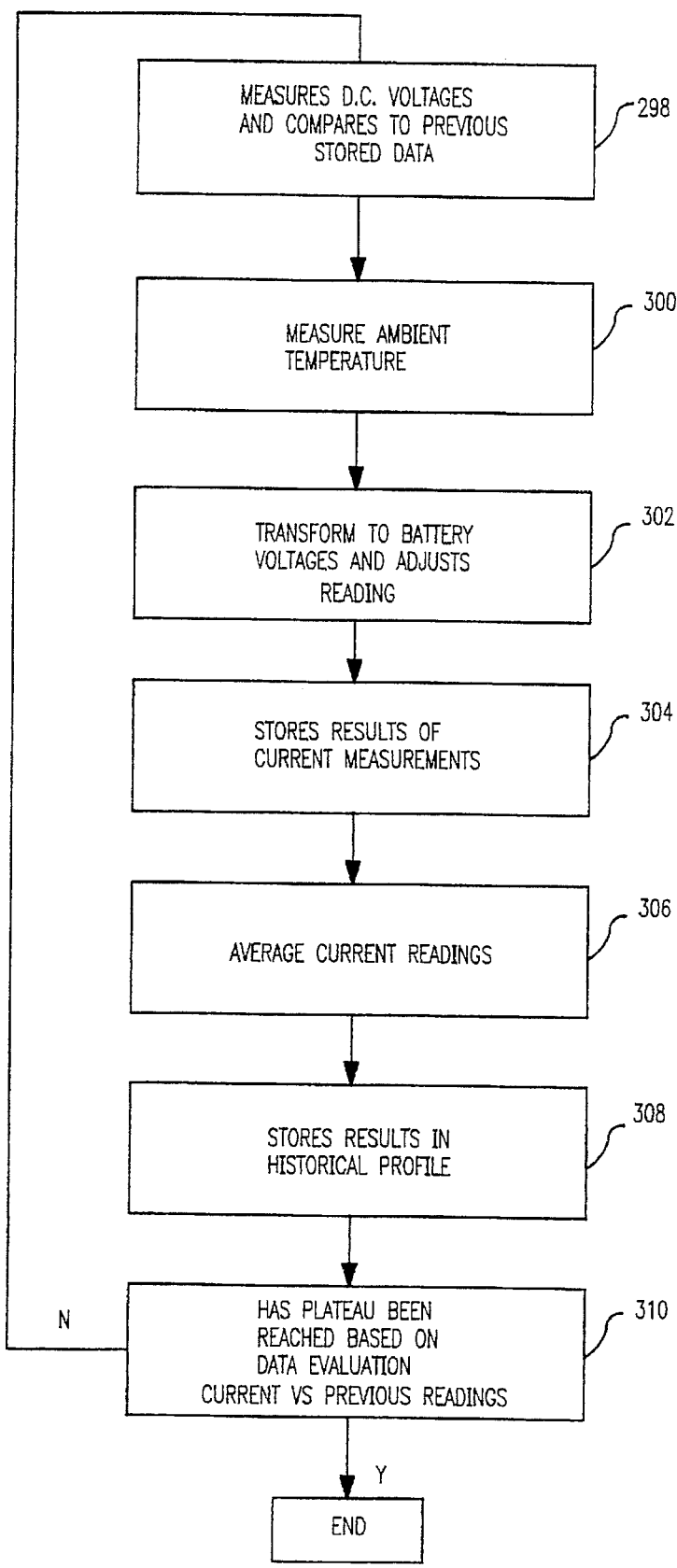
FIG. 5 is an AMR battery voltage measurement flow diagram.

FIG. 3 shows the battery monitoring flow diagram for the invention. The first step of the algorithm is the start 100 of the process. After the start of the algorithm, the next step 102 is to check the A.C. input. If A.C. is present, as indicated in step 104, then the system must measure battery voltage as noted in step 106. Upon the voltage being measured, the system must determine whether the batteries are being overcharged or undercharged as noted in step 108. This coincides with region A in FIG. 2. If either abnormal condition is true, a battery alarm is activated as noted in step 112. If neither is true, then the state of the battery alarm is checked as noted in step 109 and the process repeats to step 102. If the battery alarm was set and the condition returned to normal, the alarm is cleared as noted in step 110. If A.C. is not present, then the A.C. fail alarm is activated as noted in step 114. Subsequently, a measurement of battery voltages is taken as noted in step 116. The algorithm illustrated in FIG. 5 is then performed. Then, it is determined whether a plateau voltage has been reached as noted in step 118, and if not, the battery voltages are again measured. The nominal plateau voltage is determined as noted above. If a plateau has been reached, the forecasted voltage level for the 50% capacity point is determined and stored in memory 70 as noted in step 119. It is then determined whether the midpoint or low battery cutoff voltage has been reached as noted in step 122. If neither has been reached, then the battery voltages are again measured as noted in step 120. If the midpoint or low battery cutoff voltage has been reached, then a battery alarm message is activated as noted in step 124 and the system is returned to step 102 to check if the A.C. input has returned.

The alarm messages reported by the DAMS system for the rectifier (A.C. loss) and D.C. alarm (50% capacity point) include sufficient information to determine the load time capacity of the D.C. battery plant system at the specific site under test. Both alarm messages contain time stamps for the exact activation time of the alarm. The time interval between the rectifier alarm (A.C. failure) and D.C. alarm (50% capacity) is equivalent to half of the actual load time capacity of the D.C. battery plant system or two times the interval for the total load time capacity of the system. Custom reports based on special software enhancements can be provided by the DAMS system 24.

Figure 4:
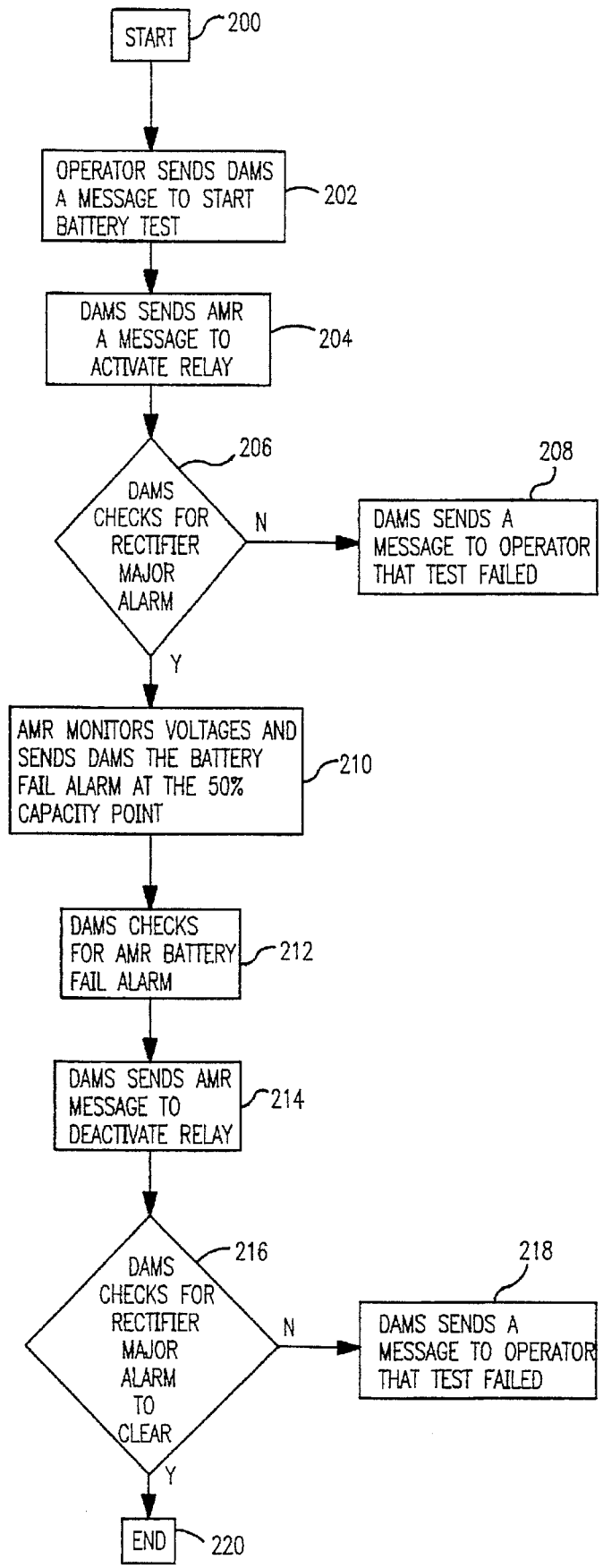
FIG. 4 is an automatic battery capacity test flow diagram.

FIG. 4 is an automatic battery capacity test algorithm flow diagram. The first step of the algorithm is the start 200 of the process. After the start of the algorithm, the next step 202 is an operator sending the DAMS unit 24 a message to start a battery test. Once that is done, the next step 204 is to indicate that the DAMS unit 24 has sent the AMR device 10 a message to activate the control relay 80. Then, the next step 206 is for the DAMS unit 24 to check for a rectifier major alarm. If that check proves negative, the control activation has failed. Then, the next step 208 is to have the DAMS unit 24 send a message to the operator that the test has failed and the operator can retry the activation or abort the process. If the, rectifier check was affirmative, then the next step 210 is to have the AMR device 10 monitor the D.C. voltages, evaluate the performance of the D.C. battery plant and send the DAMS unit 24 a battery fail alarm at the 50% capacity point. The next step 212 is to have the DAMS unit 24 check the AMR battery fail alarm. The next step 214 is to have the DAMS unit 24 send the AMR device 10 a message to deactivate the relay 80. The next step 216 is to have the DAMS unit 24 check for a clearing of the rectifier major alarm. If that check produces a negative result, then the next step 218 is to have the DAMS unit 24 send a message to the operator that the test has failed. If that check for the rectifier major alarm produced an affirmative response, then the next step is to end the automatic battery capacity test as in block 220.

FIG. 5 shows an AMR battery voltage measurement flow diagram. The first step 298 of the algorithm is to ensure the measurement of the D.C. voltages and their comparison to similar data previously stored in memory. The second step 300 of the algorithm indicates that ambient temperature is measured. The next step 302, after the temperature is measured, is to transform the temperature measurement into a voltage for one of the two temperature ranges noted above and have this voltage adjust the reading of the actual battery voltages. The next step 304 in the process is to have the adjusted voltage readings stored as current measurements. The next step 306, after current measurements are stored, is to average these current measurements and determine the effective D.C. battery voltage readings. The next step 308 is to store the effective D.C. battery voltage readings into the memory of the AMR device 10 as a historical profile of the battery plant. The last step 310 to determine if the plateau voltage has been reached based on the data evaluation of current versus previous readings. If it has, the process has been completed. If not, the algorithm returns to its beginning step 298.

What is claimed:

1. Apparatus for monitoring performance of a battery or system of connected batteries in a large battery plant facility, comprising an A.C. power source located at a predetermined application site;

a means to interrupt power from the A.C. power source;

a means to monitor D.C. battery power to equipment at said application site when said A.C. power is interrupted;

a means to automatically detect and measure a changing voltage level of said D.C. power plant capacity by applying a percentage to the difference between a calculated plateau voltage and a predetermined end of life voltage and then adding the result of applying the percentage to the difference to said predetermined end of life voltage;

a means to automatically generate an alarm message at said application site when said D.C. power is measured to be at a predetermined voltage capacity level; and a means to determine the remaining life of said D.C. power means when said predetermined capacity level has been determined.

2. The apparatus of claim 1 wherein said predetermined voltage capacity is at a fifty percent level.

3. The apparatus of claim 2 wherein said D.C. capacity level measuring means determines if said fifty percent level of D.C. power has not been reached.

4. The apparatus of claim 1 wherein said plateau voltage is calculated by determining a rate of change over time of D.C. voltages generated from said battery plant beginning immediately after the interruption of said A.C. power.

5. The apparatus of claim 4 further comprising a means to sense ambient temperature at said application site to adjust said plateau voltage in accordance with actual environmental conditions at the application site.

6. The apparatus of claim 5 further comprising a means to sense ambient temperature surrounding at least one battery in said system of connected batteries to ascertain if said battery is performing properly as expected.

7. The apparatus of claim 6 further including a means to generate a battery test request at said operations center which is communicated to the D.C. power measuring means.

8. The apparatus of claim 6 further including a means to generate a battery test request at said remote location which is communicated to the D.C. power measuring means.

9. The apparatus of claim 4 wherein the plateau voltage is determined to have been reached when said rate of change drops to less than four hundred millivolts.

10. The apparatus of claim 1 further comprising a means to transmit said alarm message at said application site to an operations center at a remote location.

11. The apparatus of claim 10 further comprising a means located at a facility other than at the application site or at the operations center to receive the alarm message from said application site and convert said message into appropriate form to be sent to a communications link network at the operations center.

12. The apparatus of claim 10 further comprising:

a communications link means at said operations center for receiving said alarm message from said message alarm generating means; and a computer means in connection with said communications link for triggering an alarm message to dispatch a technician to said site to ascertain if a battery needs replacement.

13. The apparatus of claim 1 further comprising multiple strings of connected batteries which are individually monitored by said apparatus to ascertain if each is capable of sustaining the operation of said equipment in the event A.C. power is interrupted.

14. The apparatus of claim 1 wherein said D.C. capacity level measuring means also determines if said batteries are experiencing an abnormal charging condition while A.C. power is sustaining the operation of the equipment.

15. The apparatus of claim 14 further comprising a means to generate an alarm whenever an abnormal charging condition occurs when said equipment at said site is being provided with A.C. power.

16. The apparatus of claim 1 wherein said D.C. capacity level measuring means determines if a low battery cutoff voltage has been reached.

17. The apparatus of claim 16 wherein a battery alarm message is activated if said low battery cutoff voltage has been reached.

18. The apparatus of claim 1 further comprising a means to automatically generate an alarm message at said application site when said A.C. power has been interrupted.

19. The apparatus of claim 1 further comprising a means to interrupt the A.C. power at the application site and to reactivate the D.C. power under software control.

20. The apparatus of claim 1 further comprising a means to sense battery case temperature to determine if an abnormal temperature condition exists, and if said condition does exist, to initiate an alarm message from said alarm generating means.

* * * * *